April 6, 1965 H. L. HALVERSON 3,177,442

WIDE-RANGE VARIABLE FREQUENCY SIGNAL SOURCE OPERATING IN PHASE LOCK WITH A NARROW-RANGE REFERENCE SIGNAL

Filed March 14, 1963

INVENTOR
HARLEY L. HALVERSON
BY Albert C. Smith
AGENT 3,177,442

WIDE-RANGE VARIABLE FREQUENCY SIGNAL SOURCE OPERATING IN PHASE LOCK WITH A NARROW-RANGE REFERENCE SIGNAL

Harley L. Halverson, Palo Alto, Calif., assignor to Hewlett-Packard Company, Palo Alto, Calif., a corporation of California Filed Mar. 14, 1963, Ser. No. 265,278
7 Claims. (Cl. 331—2)

This invention relates to a circuit for maintaining phase lock between a reference oscillator which is tunable over a narrow range of frequencies and a higher frequency oscillator which is tunable over a wide range of frequencies.

Many applications in which a signal is varied over a wide range of frequencies require that the variable oscillator have the stability of a standard or reference oscillator. This is conventionally accomplished by making the frequency of a stable reference oscillator variable only over a narrow range and by phase locking a variable high frequency oscillator to a selected harmonic of the reference oscillator. However, frequency variation of an oscillator stabilized in this manner is limited to the same percent variation as is produced in the frequency of the reference oscillator.

Accordingly, it is an object of the present invention to provide means for locking a high frequency oscillator which is tunable over a wide band to a low frequency reference oscillator which is tunable only over a narrow band of frequencies.

It is another object of the present invention to provide an improved phase lock frequency stabilizing circuit.

In accordance with one embodiment of the present invention the frequency of a reference oscillator is varied over a narrow band with a high frequency oscillator locked to a selected harmonic of the reference oscillator. The frequency of the reference oscillator is tuned from the low end to the high end of the frequency band where it is then rapidly returned to a lower frequency within the band. The response of the locking circuit is made sufficiently slow so that the high frequency oscillator which was previously phase locked to the reference oscillator at the high end of its frequency band locks on to a successively higher harmonic of the reference oscillator now operating at a lower frequency in its band. Repeated variation of the reference oscillator across its narrow band thus provides a variation of the high frequency oscillator over a very wide band in an unbroken, continuous manner.

Other and incidental objects of the present invention will be apparent from a reading of this specification and an inspection of the accompanying drawings, in which.

Figure 1:
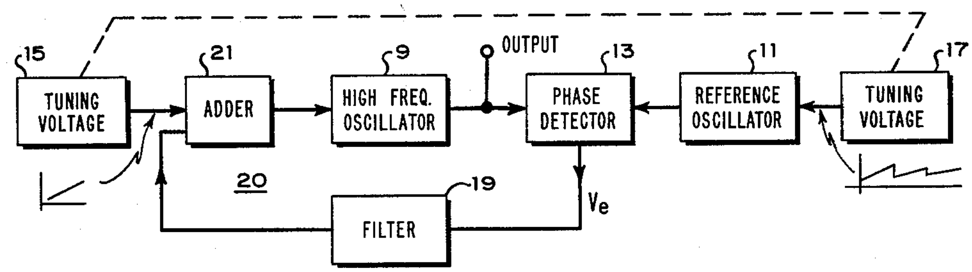
FIGURE 1 is a block diagram of one embodiment of the present invention.

Referring to FIGURE 1 there is shown a voltage-tunable high frequency oscillator 9 and a voltage-tunable reference oscillator 11 connected to a phase detector 13. Phase detector 13 may be of the sampling type which produces a steady voltage $Ve$ at its output as a function of the phase separation between the signal from high frequency oscillator 9 and a selected harmonic of the signal from reference oscillator 11. Phase detectors of this type are described in U.S. patent application Serial No. 228,120 filed October 3, 1962, by Giacomo Vargiu. A small variation in the frequency of the signal from high frequency oscillator 9 is achieved by varying the tuning voltage 17 and thus the frequency of reference oscillator 11 and by simultaneously varying the tuning voltage 15 applied to the high frequency oscillator 11. Any phase differences between the output of oscillator 9 and the selected harmonic of the output from reference oscillator 11 due, for example, to improper tracking of the tuning voltages or to dissimilarities in the frequency vs. voltage characteristics of the oscillators over the range of frequency variation appears as an error voltage $Ve$ at the output of the phase detector 13. This voltage is filtered by filter 19 and is combined in adder 21 with the tuning voltage 15. The frequency of oscillator 9 is corrected in response to the applied combination of voltages from adder 21. This error voltage $Ve$ approaches zero and phase lock is maintained as the tracking error between the tuning voltages 15 and 17 is decreased.

Figure 2:
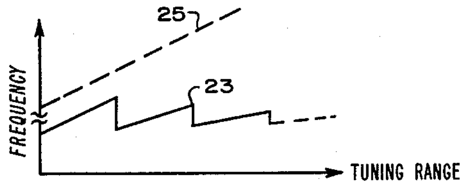
FIGURE 2 is a graph showing the frequency relationships between a reference oscillator and another oscillator over the tuning range.

Wide variations in the output frequency of the high frequency oscillator 11 are achieved as described above until the reference oscillator 11 is tuned to its maximum frequency. At this point the tuning voltage applied to the reference oscillator 11 and, hence, its operating frequency is decreased rapidly to a lower value. The high frequency oscillator 9 is unable to follow during this rapid change in frequency and the feedback loop 20 is broken by virtue of the fact that phase lock no longer exists. The response of the feedback loop 20 is chosen sufficiently slow so that no significant change in the frequency of oscillator 9 occurs. As a result, phase lock is restored between the frequency of the oscillator 9 and a successively higher harmonic of the reference oscillator 11 which is now operating at a lower frequency. The graph of FIGURE 2 shows the relationship between the variation in the frequency of reference oscillator 11 (curve 23) and the resulting variation in the frequency of high frequency oscillator 9 (curve 25) over the tuning range of the circuit. Curve 23 shows the decreasing difference between maximum and minimum frequencies of the reference oscillator 11 as phase lock is established on successively higher harmonics. Phase-locked operation achieved in this maner between the high frequency oscillator and successive harmonics of the reference oscillator thus provides continuous wide band tuning of the high frequency oscillator using only narrow band variations in the frequency of the reference oscillator.

The maximum open-loop difference or error frequency which enables the oscillators to pull together and phase lock is dependent upon the frequency response of the feedback loop 20. It is desirable to make this pull-in or capture range very large to eliminate the critical dependency of the circuit operation upon the tracking of the voltages from tuning voltage sources 15 and 17. The hold-in range once phase-locked operation is established is dependent upon the gain around the feedback loop 20. Extending the frequency response of the feedback loop 20 or increasing the loop gain also increases the bandwidth over which noise is transmitted. A given level of tolerable noise thus imposes a serious limitation upon the width of the capture range and hold-in range obtainable in the circuit. Increasing the loop gain to increase the width of the hold-in range is undesirable beyond a fixed minimal limit of loop gain.

Figure 3:
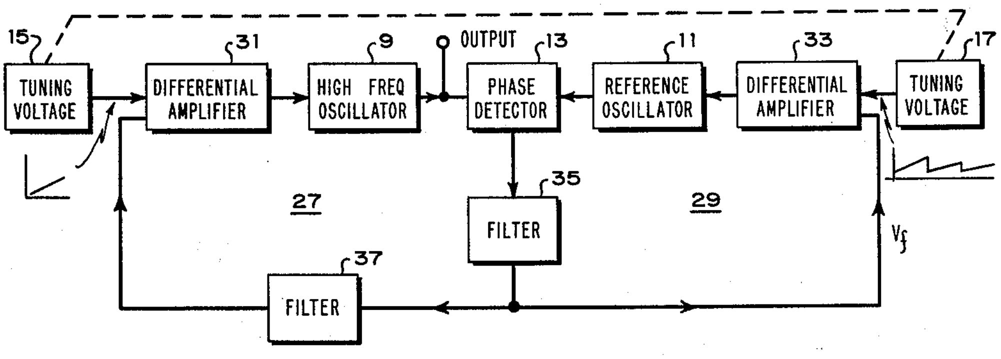
FIGURE 3 is a block diagram showing a modification of the diagram of FIGURE 1.
Figure 4:
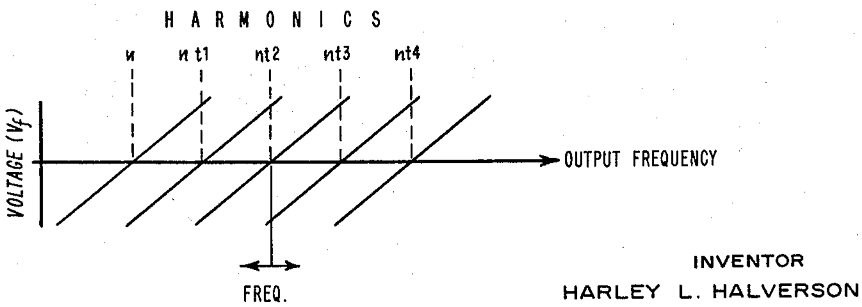
FIGURE 4 is a graph showing the relationship between the output frequency and the feedback voltage for the reference oscillator of FIGURE 3.

In order to increase the width of the capture range without increasing the noise bandwidth and to make the loop gain independent of the hold-in range, the circuit of FIGURE 1 is modified as shown in FIGURE 3. A pair of feedback loops 27 and 29 are provided. Loop 29 provides the proper amount of loop gain and the proper filter characteristics to determine the desired hold-in and capture ranges. Loop 27 provides the proper amount of loop gain and the proper filter characteristics to determine the stability and the noise bandwidth. The $n^{th}$ harmonic of the reference oscillator 11 is phase locked to the high frequency oscillator 9 by the operation of the phase detector 13 and the feedback loop 29 in the manner previously described. The reference oscillator 11 and the high frequency oscillator 9 track over a wide band by tuning reference oscillator 11 in a saw-tooth manner between upper and lower frequency limits and by phase-locking successive harmonics of the reference oscillator 11 to the high frequency oscillator 9. If the reference oscillator 11 shows a linear relationship between tuning voltage and output frequency then the tuning voltage applied to reference oscillator 11 is directly proportional to the frequency of high frequency oscillator 9. The phase-locked reference oscillator 11 in conjunction with feedback loop 29 thus operates as a frequency discriminator which has a voltage-frequency characteristic as shown in the graph of FIGURE 4. The center frequency of this discriminator tracks the frequency of the high frequency oscillator 9. The discriminator voltage at the output of filter 35 is compared with the output of the source of tuning voltage 15 in differential amplifier 31. The error signal thus produced is applied to the high frequency oscillator 9 to correct for frequency deviations in the oscillator 9. The reference oscillator 11 is thus phase locked to the high frequency oscillator 9 and the high frequency oscillator 9 is frequency locked to the reference oscillator 11. This circuit has the advantage that the phase-lock loop 29 may be adjusted for optimum capture and hold-in characteristics and the frequency-lock loop 27 may be adjusted independently for optimum noise and frequency stability characteristics. The frequency of the output signal from oscillator 9 thus varies continuously over a wide band of frequencies as the frequency of refernce oscillator 11 varies in a saw-tooth manner between narrow upper and lower frequency limits.

Therefore, the circuit of the present invention provides wide variations in the output frequency of an oscillator which has the stability approaching that of a reference oscillator. This is accomplished by maintaining phase lock and frequency lock between the two oscillators over an entire range of operation.

I claim:

1. A stabilized signal source comprising:
first and second oscillators, each producing a signal having a frequency which is continuously variable over a selected range;
means for varying the frequency of the signal produced by the first oscillator over selected portions of said range;
phase responsive means connected to receive the output of each of said oscillators;
said phase responsive means being insensitive to rapid changes in one direction of the frequency of the first oscillator and being adapted to produce a signal related to the phase difference between the output of the second oscillator and selected harmonics of the output of the first oscillator for changes of the frequency thereof in the opposite direction;
a source of tuning signal for said second oscillator;
and means connected to said second oscillator for applying thereto the combination of said tuning signal and the signal produced by said phase responsive means.

2. A stabilized signal source comprising:
first and second oscillators, each producing a signal having a frequency which is continuously variable over a selected range;
means connected to said first oscillator for tuning the frequency thereof in one direction over a portion of said range and for rapidly changing said frequency in the opposite direction at a selected frequency value in said range;
phase responsive means connected to receive the output of each of said oscillators;

said phase responsive means being insensitive to rapid changes in frequency in said opposite direction and being adapted to produce a signal related to the phase difference between the output of the second oscillator and selected successive harmonics of the output of the first oscillator for variations in the frequency thereof in said one direction;
a source of tuning signal for said second oscillator;
and means connected to said second oscillator for applying thereto an error signal related to the difference between said tuning signal and the signal produced by said phase responsive means.

3. A frequency stabilizing signal source comprising:
a signal-responsive reference oscillator and a signal-responsive high frequency oscillator, each producing a frequency which is within a given range and which is related to the signal applied thereto;
a source of tuning signal connected to said reference oscillator for varying the frequency thereof in a frequency increasing direction over portions of said range and for rapidly decreasing the frequency thereof at selected frequency values in said range to produce a sawtooth-type curve of frequency;
phase responsive means connected to receive the output of each of said oscillators;
said phase responsive means being insensitive to rapid decreases in the frequency of said reference oscillator and being adapted to produce a signal related to the phase difference between the output of the high frequency oscillator and selected successively higher harmonics of the output of the reference oscillator for variations in the frequency thereof in said frequency increasing direction;
a source of tuning signal for said high frequency oscillator;
and means connected to said high frequency oscillator for applying thereto an error signal related to the difference between said tuning signal and the signal produced by said phase responsive means.

4. A signal source as in claim 3 wherein said tuning signals for said reference oscillator and said high frequency oscillator are varied simultaneously.

5. A stabilized signal source comprising:
first and second signal-responsive oscillators, each producing a signal having a frequency which is continuously variable over a selected range in response to signal applied thereto;
phase responsive means connected to receive the output of each of said oscillators;
said phase responsive means being insensitive to rapid decreases in the frequency of the first oscillator and being adapted to produce a signal related to the phase difference between the output of the second oscillator and selected harmonics of the output of the first oscillator as the frequency thereof increases;
a first source of tuning signal for said first oscillator for varying the frequency thereof in the frequency-increasing direction over portions of said range and for rapidly decreasing said frequency at predetermined frequency values in said range;
means connected to said first oscillator for applying thereto the combination of said tuning signal from said first source and the signal from said phase responsive means;
a second source of tuning signal for said second oscillator;
and means connected to said second oscillator for applying thereto the combination of said tuning signal from said second source and the signal produced by said phase responsive means for increasing the frequency of the second oscillator as the frequency of the first oscillator increases.

6. A stabilized signal source comprising:
first and second signal-responsive oscillators, each producing a signal having a frequency which is continuously variable over a selected range in response to signal applied thereto;

phase responsive means connected to receive the output of each of said oscillators;

said phase responsive means being insensitive to rapid changes in one direction of the frequency of the first oscillator and being adapted to produce a signal related to the phase difference between the output of the second oscillator and selected harmonics of the output of the first oscillator for changes in the frequency thereof in the opposite direction;

a first source of tuning signal for said first oscillator for continuously varying the frequency thereof in said opposite direction over portions of said range and for rapidly changing said frequency in said one direction at predetermined frequency values in said range;

means connected to said first oscillator and forming a first feedback loop for applying to said first oscillator the combination of said tuning signal from said first source and the signal from said phase responsive means;

a second source of tuning signal for said second oscillator;

and means connected to said second oscillator and forming a second feedback loop for applying to said second oscillator the combination of said tuning signal from said second source and the signal produced by said phase responsive means to increase the frequency of the second oscillator as the frequency of the first oscillator increases;

the first feedback loop having higher frequency response than the second feedback loop.

7. A frequency stabilized signal source comprising:

a first oscillator continuously tunable over a narrow range of frequencies;

a second oscillator continuously tunable over a wide range of frequencies in response to a signal applied thereto;

circuit means connected to receive the outputs of said first and second oscillators and adapted to produce an output signal related to the variation of said oscillators from a predetermined phase relationship;

means connected to said first oscillator for varying the frequency thereof repetitively over selected portions of said range;

and means connected to said second oscillator and adapted to receive said output signal to vary the frequency of said second oscillator over successive portions of said range for each traversal of a portion of the range of said first oscillator for maintaining said predetermined phase relationship between the second oscillator and successive harmonics of the output of the first oscillator during each of said traversals of said range.

References Cited by the Examiner

FOREIGN PATENTS

| | | |
|---|---|---|
| 588,739 | 12/59 | Canada. |
| 1,180,065 | 12/58 | France. |

ROY LAKE, *Primary Examiner.*

JOHN KOMINSKI, *Examiner.*